(12) United States Patent
Kim et al.

(10) Patent No.: US 6,573,545 B2
(45) Date of Patent: Jun. 3, 2003

(54) SEMICONDUCTOR MEMORY DEVICE FOR ELIMINATING FLOATING BODY EFFECT AND METHOD OF FABRICATING THE SAME

(75) Inventors: Chang-Hyun Kim, Kyungki-do (KP); Kyung-Ho Kim, Kyungki-do (KP); Won-suk Yang, Kyungki-do (KP)

(73) Assignee: Samsung Electronics Co. Ltd., Suwon (KR)

(*) Notice: Subject to any disclaimer, the term of this patent is extended or adjusted under 35 U.S.C. 154(b) by 0 days.

(21) Appl. No.: 09/882,489

(22) Filed: Jun. 15, 2001

(65) Prior Publication Data

US 2002/0022360 A1 Feb. 21, 2002

Related U.S. Application Data

(60) Provisional application No. 60/211,937, filed on Jun. 15, 2000.

(30) Foreign Application Priority Data

Feb. 26, 2001 (KP) .................................. 01-9604

(51) Int. Cl.[7] .............................................. H01L 27/108
(52) U.S. Cl. ...................................... 257/296; 438/637
(58) Field of Search ................................ 438/149, 257, 438/637; 257/192, 296, 321, 347, 349–351, 345, 410, 407, 616

(56) References Cited

U.S. PATENT DOCUMENTS 5,698,869 A * 12/1997 Yoshimi et al. ............. 257/192
6,072,209 A    6/2000 Noble et al. ................ 257/296
6,229,169 B1 * 5/2001 Hofmann et al. ........... 257/296
6,424,001 B1 * 7/2002 Forbes et al. ............... 257/315

* cited by examiner

Primary Examiner—David Nelms
Assistant Examiner—David Vu
(74) Attorney, Agent, or Firm—Marger Johnson & McCollom P.C.

(57) ABSTRACT

A semiconductor memory device from which a floating body effect is eliminated and which has enhanced immunity to external noise, and a method of fabricating the same are provided. The memory device includes a semiconductor substrate. A plurality of bit lines are buried in the semiconductor substrate such that the surfaces of the bit lines are adjacent to the surface of the semiconductor substrate. The bit lines are arranged in parallel with one another. A plurality of word lines are formed on the semiconductor substrate so that the word lines cross and are isolated from the bit lines. A plurality of vertical access transistors are formed at individual memory cells where the bit lines and the word lines intersect. Each vertical access transistor includes a first source/drain region, a body region including a vertical channel region and a second source/drain region which are formed sequentially on the bit line. The vertical access transistor contacts a gate insulation layer formed on a portion of one side of the sidewalls of the word line. Body regions including the channel regions of the access transistors are connected to one another to be a single integrated region.

29 Claims, 12 Drawing Sheets

SEMICONDUCTOR MEMORY DEVICE FOR ELIMINATING FLOATING BODY EFFECT AND METHOD OF FABRICATING THE SAME

This application claims benefit of Provisional Application No. 60/211,937 filed Jun. 15, 2000.

BACKGROUND OF THE INVENTION

1. Field of the Invention

The present invention relates to a semiconductor memory device, and more particularly, to a cell array in which data are stored in a semiconductor dynamic random access memory (DRAM). Specifically, the present invention relates to a semiconductor memory device having a memory cell with a vertical transistor and a method of fabricating the same.

2. Description of the Related Art

Numerous methods for increasing the integration density of semiconductor memory devices have been researched. Specifically, methods using a vertical transistor have been researched to reduce the area of a unit cell. However, as the integration density of the devices increases and the operating voltage decreases, a silicon body effect, which is one factor determining the reliability of semiconductor memory devices, becomes more influential in the control of the threshold voltage of devices.

FIG. 1 is a perspective view of some memory cells of a conventional semiconductor memory device using a vertical transistor. FIG. 2 is a plan view of FIG. 1. FIGS. 1 and 2 correspond to FIGS. 2 and 3, respectively, of U.S. Pat. No. 6,072,209.

FIGS. 1 and 2 illustrate two buried bit lines 202 and 204, a pair of word lines 206 and 207, another word line 208, and four memory cells 112a, 112b, 112c and 112d on a semiconductor substrate 210. Each of the bit lines 202 and 204 is defined by isolation trenches 220, 221 and 222 extending top to bottom in FIG. 2 that are filled with an insulating material such as silicon dioxide 224. A vertical transistor 130 is formed in each memory cell. Each vertical transistor 130 contacts a gate insulation layer 218 formed on the sidewall of a word line 206, 207 or 208. Each vertical transistor further includes first source/drain region 212, a body region 214 including a channel region, and a second source/drain region 216, which are formed vertically on the semiconductor substrate 210. The first source/drain region 212 functions as a bit line. A storage electrode 132 of a capacitor is formed on the second source/drain region 216. In such a structure, the body region 214 including the channel region of each memory cell floats completely and is separated from the body regions of the other transistors 130 by the word lines 206, 207 and 208.

In such a prior art structure, each memory cell storing data is very vulnerable to external noise. Generally, a MOS transistor is actuated by a channel region which is formed in the vicinity of the surface of a body region by a voltage applied to a gate electrode. When the body region of the MOS transistor is exposed to external supply voltage noise due to a variety of reasons, the charge of the body region of the transistor changes. In the prior art, body regions float and are separated from one another such that the charge of each transistor is not consistent. Accordingly, when the charge of the body region of each transistor changes due to external noise, the threshold voltage of each MOS transistor changes. Consequently, errors occur during operation, thereby decreasing the reliability of the memory device.

SUMMARY OF THE INVENTION

To solve the above problem, it is a first objective of the present invention to provide a semiconductor memory device from which a floating body effect is substantially eliminated and which has enhanced immunity to external noise, and a method of fabricating the same.

It is a second objective of the present invention to provide a semiconductor memory device from which a floating body effect is substantially eliminated and in which a memory cell has a surface area that is minimized to $4F^2$, and a method of fabricating the same.

Accordingly, to achieve the above objects of the invention, there is provided a semiconductor memory device that does not have a floating body effect. The memory device includes a semiconductor substrate. A plurality of bit lines are buried in the semiconductor substrate such that the surfaces of the bit lines are adjacent to the surface of the semiconductor substrate. The bit lines are arranged to be parallel to one another. A plurality of word lines are formed on the semiconductor substrate so that the word lines cross and are isolated from the bit lines. A plurality of vertical access transistors are formed at individual memory cells where the bit lines and the word lines intersect. Each vertical access transistor includes a first source/drain region, a channel region and a second source/drain region which are formed vertically on a bit line. The vertical access transistor contacts a gate insulation layer formed on part of the sidewall of a word line. Body regions including the channel regions of the access transistors are connected to one another to be a single integrated (electrically interconnected) region.

Preferably, the semiconductor memory device is a cell array for a dynamic random access memory, and a storage electrode of a capacitor is formed on the second source/drain region of each access transistor. The body regions of the access transistors may be formed by a single deposition process and a patterning process, thereby forming a single integrated body. Alternatively, the body regions of the access transistors may be isolated from one another by the word lines but connected to one another by a bridge-like connector so that they are integrated. An insulation layer having the same thickness as that of the gate insulation layer is formed on the sidewall of each word line. Preferably, the word line at which each access transistor is formed has a quadrilateral shape of which one side is open in a plan view, and the channel region of the access transistor is formed within the quadrilateral shape.

To achieve the above objects of the invention, in a first embodiment, there is provided a semiconductor memory device including a semiconductor substrate on which trench regions filled with an insulating material are arranged at predetermined intervals. A plurality of bit lines are arranged parallel to one another between the trench regions on the semiconductor substrate. A plurality of word lines extend on the trench regions of the semiconductor substrate so that the word lines cross the bit lines. The sidewall and the top of each word line are covered with an insulating material. A plurality of vertical access transistors are formed at individual memory cells where the bit lines and the word lines intersect. Each vertical access transistor includes a first source/drain region, a channel region and a second source/drain region which are formed vertically on a bit line. The vertical access transistor contacts a gate insulation layer formed on part of the sidewall of a word line. A single monolithic body region or integrated plural body regions includes adjacent body regions that are insulated from the word lines. The adjacent body regions including the channel regions are isolated by the word lines but are integrated through (over) the top of the insulating material on the word lines.

In a second embodiment, there is provided a semiconductor memory device including a semiconductor substrate on which trench regions filled with an insulating material are arranged at predetermined intervals. A plurality of bit lines are arranged parallel to one another between the trench regions on the semiconductor substrate. A plurality of word lines extend on the trench regions of the semiconductor substrate so that the word lines cross the bit lines. The sidewall of each word line is covered with an insulating material. A plurality of vertical access transistors are formed at individual memory cells where the bit lines and the word lines intersect. Each vertical access transistor includes a first source/drain region, a body region including a channel region and a second source/drain region which are formed sequentially overlying one of the bit lines. The vertical access transistor contacts a gate insulation layer formed on one side of the sidewalls of the word lines. A plurality of body regions are formed to be insulated from the word lines. A connector is formed to electrically connect adjacent body regions.

To achieve the above objects of the invention, in the first embodiment, there is provided a method of fabricating a semiconductor memory device. The method includes the step of forming trench regions filled with an insulating material at predetermined intervals. The trench regions are buried in a semiconductor substrate such that they are adjacent to the surface of the semiconductor substrate. A bit line is formed between adjacent trench regions in the semiconductor substrate, and the surface of the semiconductor substrate is planarized to expose the surface of the bit line. A first insulation layer, a conductive layer for a word line and a mask layer of an insulating material are sequentially formed on the entire surface of the planarized semiconductor substrate. A word line having the mask layer is formed on its top surface by performing photolithography. A second insulation layer is formed on the sidewall of the exposed word line. A portion of the surface of the bit line adjacent to the sidewall of the word line is exposed in a region where the word line and the bit line intersect. A first source/drain region material layer is formed on the exposed bit line. A body region material layer is formed on the entire surface of the semiconductor substrate including the first source drain region material layer such that the body region material layer has a predetermined height from the mask layer on the word line. A portion of the body region material layer is etched using photolithography so that the body region material layer corresponds to the first source/drain region material layer. A second source/drain material layer is formed on the etched and exposed body region material layer.

In the second embodiment, there is provided a method of fabricating a semiconductor memory device. The method includes the step of forming trench regions filled with an insulating material at predetermined intervals. The trench regions are buried in a semiconductor substrate such that they are adjacent to the surface of the semiconductor substrate. A bit line is formed between adjacent trench regions in the semiconductor substrate, and the surface of the semiconductor substrate is planarized to expose the surface of the bit line. A first insulation layer and a conductive layer for a word line are sequentially formed on the entire surface of the planarized semiconductor substrate. A word line is formed by photolithography and etching. A second insulation layer is formed on the exposed word line. Part of the surface of the bit line adjacent to the sidewall of the word line is exposed at a portion where the word line and the bit line intersect. A first source/drain region material layer is formed on the exposed bit line. A body region material layer is formed on the entire surface of the semiconductor substrate including the first source drain region material layer such that the body region material layer is higher than the word line. The body region material layer is polished until the surface of the word line is exposed to planarize the surface of the semiconductor substrate. A third insulation layer is formed on substantially the entire surface of the planarized semiconductor substrate. A portion of the third insulation layer is etched by performing photolithography so that the third insulation layer corresponds to the first source/drain region material layer. A portion of the body region material layer is etched using the etched third insulation layer as an etching mask. A second source/drain material layer is formed on the exposed body region material layer.

According to the present invention, body regions of transistors in individual memory cells do not float but are integrated into one so that noise introduced to each memory cell in a memory device can be easily eliminated. As a result, the charge of a body region of each transistor can be maintained constant without being influenced by noise so that malfunction of the transistor can be prevented. In addition, the gate electrode of a vertical transistor is formed to have a quadrilateral shape whose one side is open so that it can be easy to realize a memory cell having an area of $4F^2$.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE PRESENT INVENTION

Figure 1:
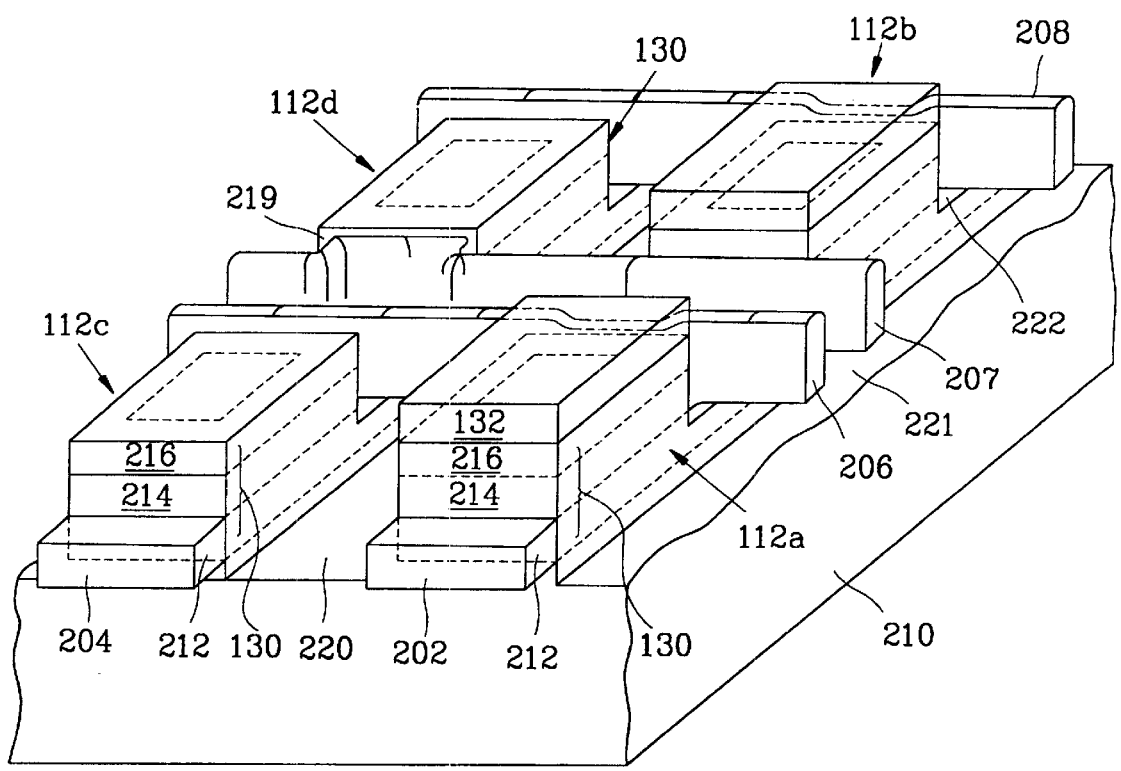
FIG. 1 is a perspective view of some memory cells of a conventional semiconductor memory device using a vertical transistor.
Figure 2:
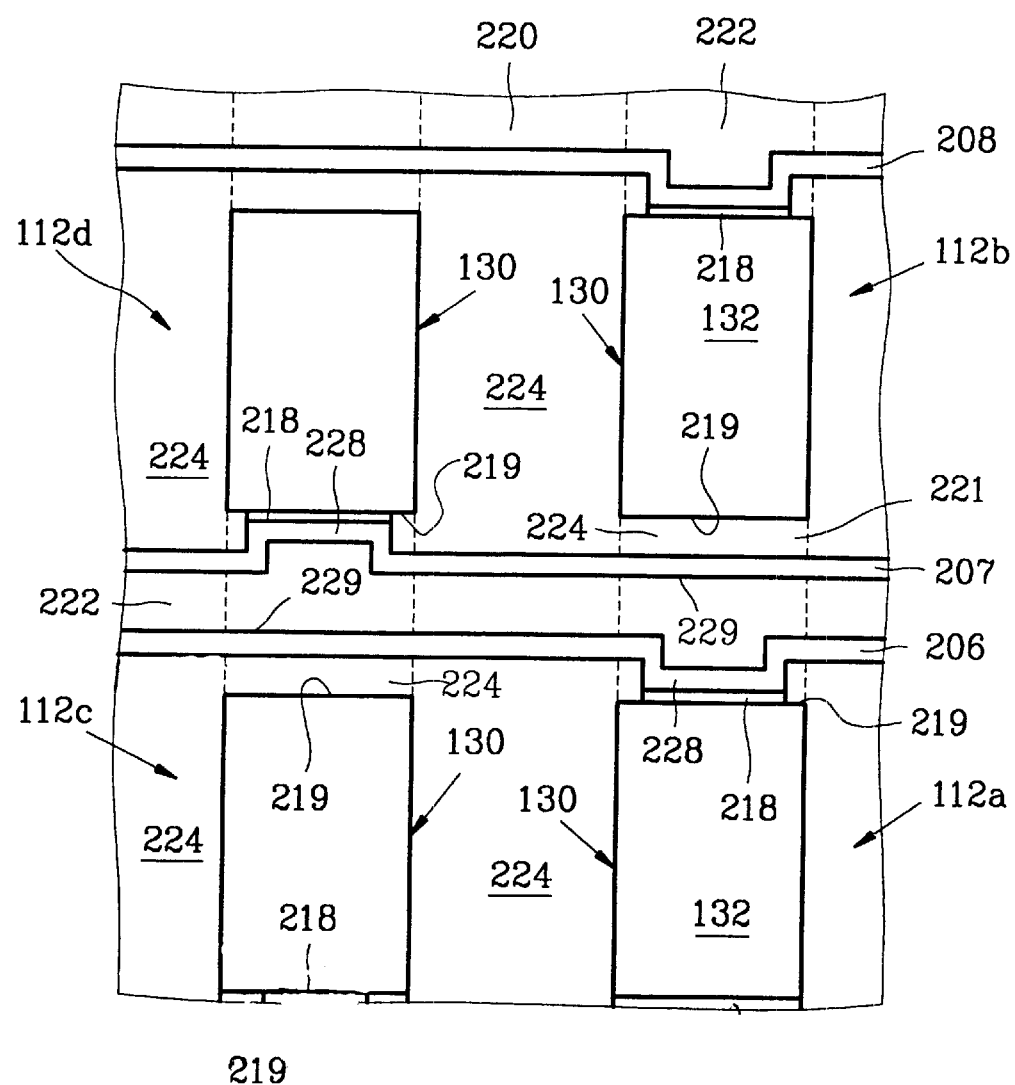
FIG. 2 is a plan view of FIG. 1.

Hereinafter, embodiments of the present invention will be described in detail with reference to the attached drawings.

The present invention is not restricted to the following embodiments, and many variations are possible within the sprit and scope of the present invention. The embodiments of the present invention are provided to more completely explain the present invention to one skilled in the art. In the drawings, the shapes of members are exaggerated for clarity and the same reference numerals denote the same members. Also, when a film is described as being on another film or a substrate, it can be directly on the other layer or the semiconductor substrate or an interlayer film can exist therebetween.

Figure 3:
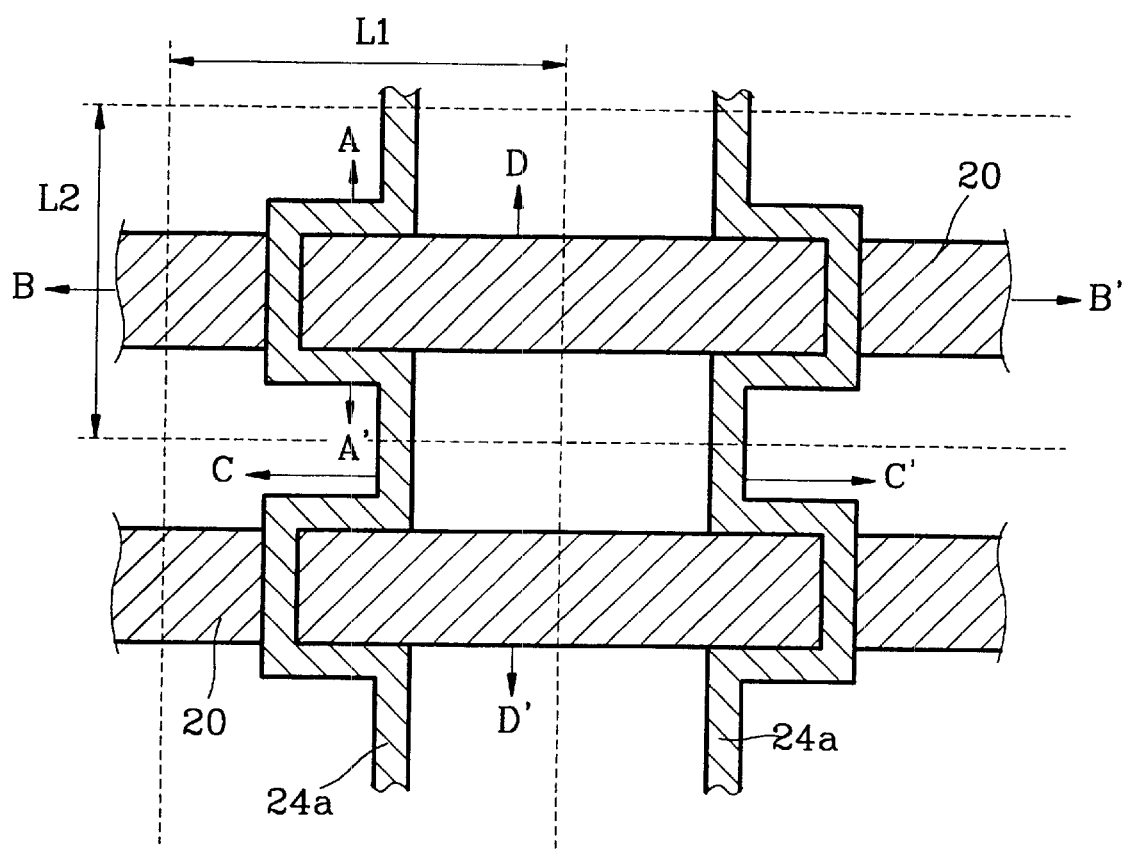
FIG. 3 is a view of a part of a memory cell array according to the present invention.
Figure 4:
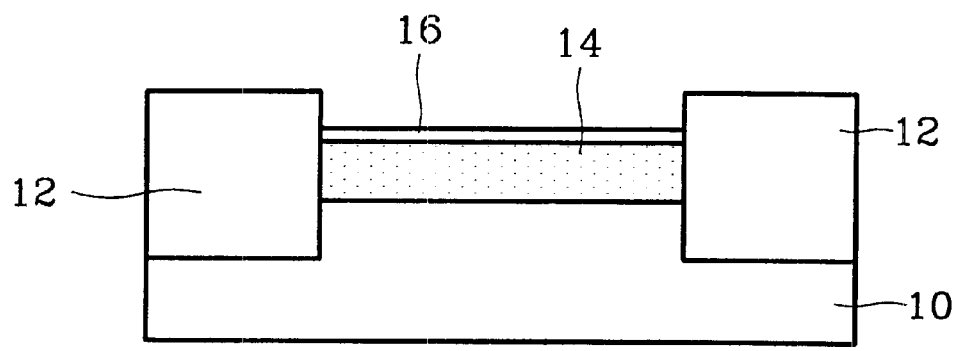
FIGS. 4 through 15 are cross-sectional views taken along the line A—A' of FIG. 3 for explaining a method of fabricating a semiconductor memory device according to a first embodiment of the present invention.

FIG. 3 is a view of a part of a memory cell array according to the present invention. Referring to FIG. 3, a plurality of bit lines 20 are arranged in parallel at predetermined intervals along the vertical axis of the drawing. A plurality of word lines 24a are arranged at predetermined intervals along the horizontal axis of the drawing. FIG. 3 illustrates four memory cells, and each memory cell is a $4F^2$ memory cell. In each memory cell, "L1" and "L2" individually denote 2F (F denotes a minimum feature according to a design rule). In each memory cell, a vertical transistor is formed at the intersection between the bit line 20 and the word line 24a. The shape of the word line 24a at the intersection in a plan view is a quadrangle of which one side is open. A vertical transistor is formed within this quadrangle.

FIGS. 4 through 15 are cross-sectional views taken along the line A—A' of FIG. 3 for explaining a method of fabricating a semiconductor memory device according to a first embodiment of the present invention. A trench region 12 as an isolation region is formed on a semiconductor substrate 10 formed of a material such as silicon. The trench region 12 is formed by conventional techniques such as a typical method of forming a stack of an oxide layer and a nitride layer, forming a trench by selectively etching the semiconductor substrate 10 using photolithography and filling the trench with an insulating material. Subsequently, a thin buffer oxide film 16 necessary for ion-implantation is formed on the exposed surface of the semiconductor substrate 10 between the trench regions 12. Next, impurities of a conductive type different from that of the semiconductor substrate 10 are ion-implanted into the semiconductor substrate 10, thereby forming an impurity junction region 14 of an n-type or a p-type different from the conductive type of the semiconductor substrate 10.

Figure 5:
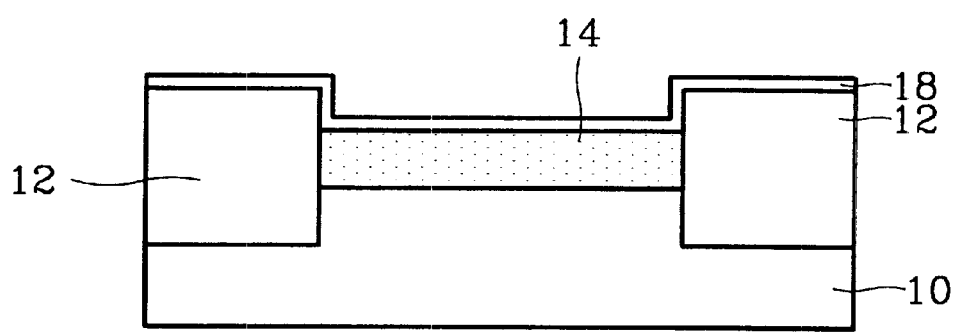
Figure 6:
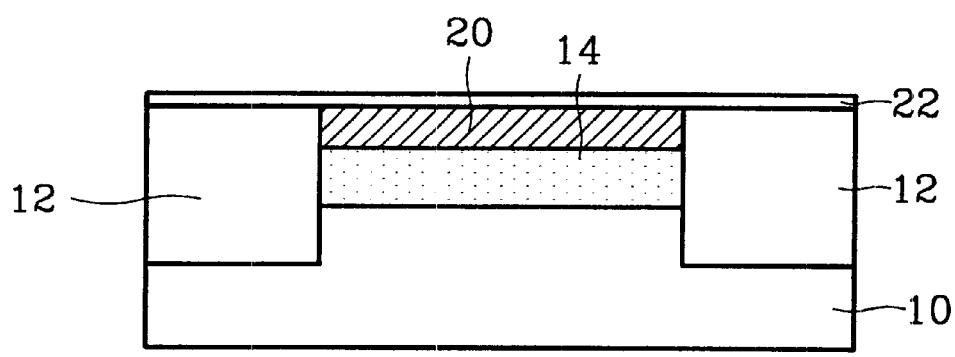

Next, referring to FIG. 5, the buffer oxide film 16 has been removed. Subsequently, a silicidation material layer 18 of titanium or cobalt is deposited on the surface of the semiconductor substrate 10 including the impurity junction region 14 and successively annealed at a temperature of approximately 500–850° C. although the annealing temperature depends on a silicidation material. A silicide layer of low resistance is thus formed to a thickness of approximately 500 Å so that the silicide layer contacts the semiconductor substrate 10, as shown in FIG. 6. This silicide layer constitutes a bit line 20.

Referring to FIG. 6, after the surface of the semiconductor substrate 10 is planarized by conventional techniques such as a chemical mechanical polishing (CMP) process, a first insulation layer 22 formed of an insulating material such as silicon dioxide is deposited over the surface of the semiconductor substrate 10.

Figure 7:
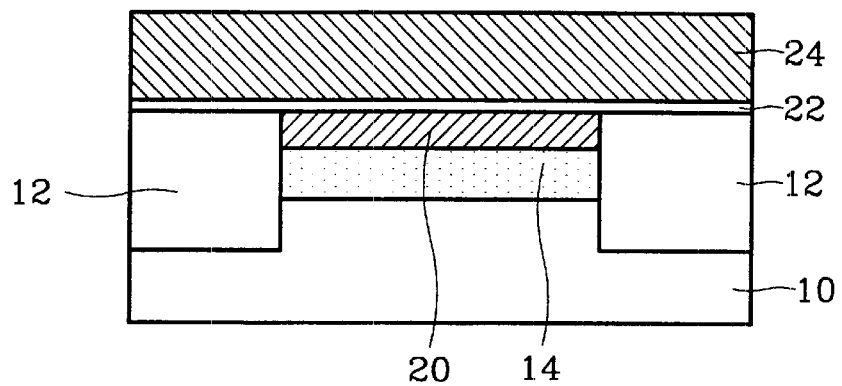
Figure 8:
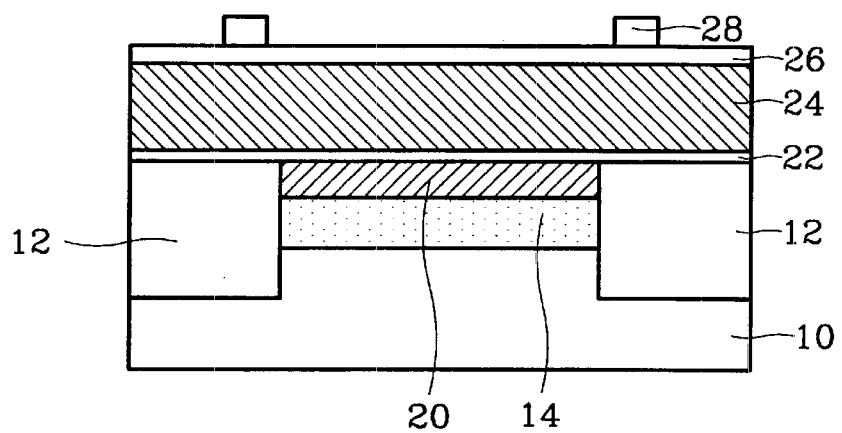

Subsequently, as shown in FIGS. 7 and 8, a polysilicon layer 24 and a silicon nitride layer 26 are sequentially formed on the first insulation layer 22, and then an etching mask pattern 28 defining word lines 24a is formed.

Figure 9:
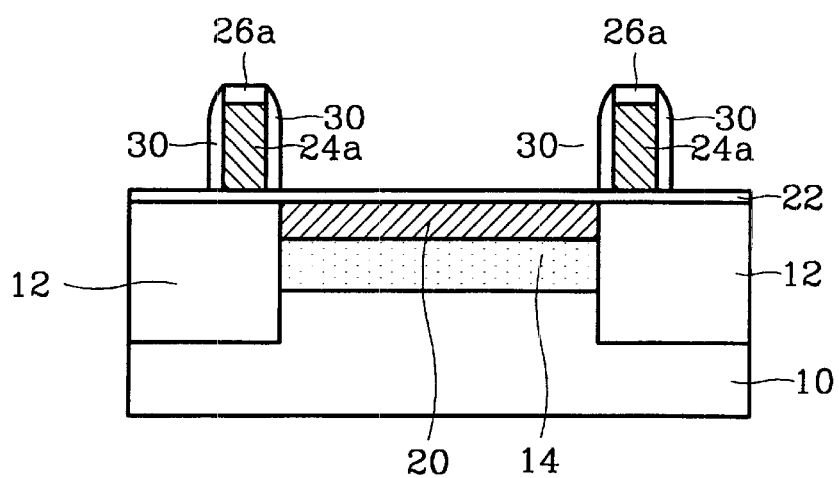

Referring to FIG. 9, the silicon nitride layer 26 and the polysilicon layer 24 are anisotropically etched using the etching mask pattern 28 as an etching mask. Thus, a word line 24a pattern is formed on which the silicon nitride layer 26 remains to form mask layers 26a.

Next, a second insulation layer 30 such as a thermal oxide layer is formed on the sidewall of the word line 24a. Here, the second insulation layer 30 is thinly formed on the sidewall of the mask layer 26a.

Figure 10:
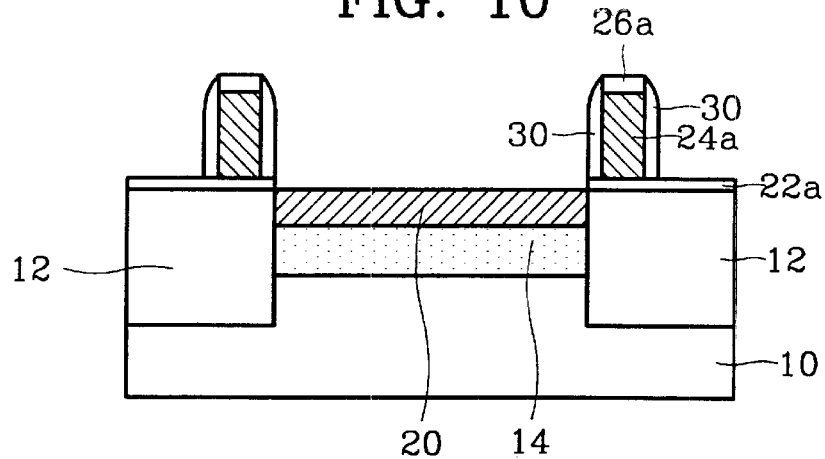

Now turning to FIG. 10, the first insulation layer 22 remaining on the bit line 20 may be seen to have been removed by selective etching using techniques such as photolithography, or alternatively, blanket etching, thereby exposing the bit line 20. Here, a first insulation layer pattern 22a may remain on or be removed from the trench region 12 outside of the word line 24a, depending on the etching method.

Figure 11:
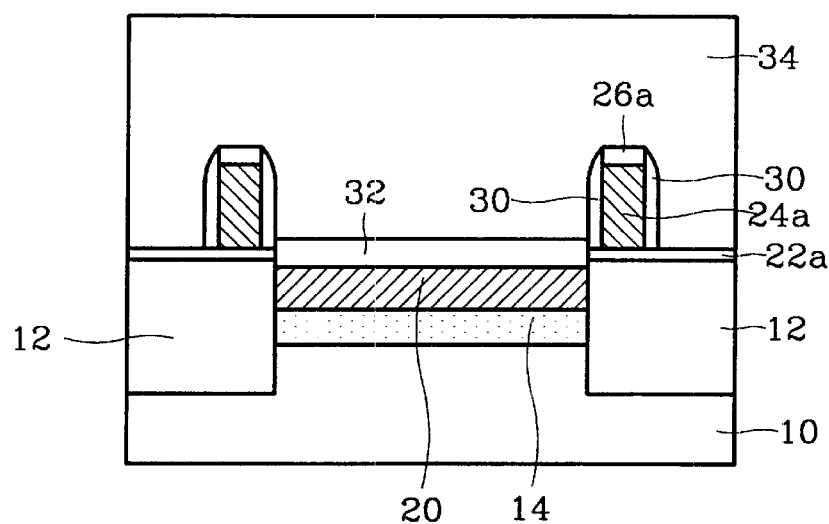

Referring to FIG. 11, a first source/drain region 32 is formed of, for example, polysilicon selectively only on the exposed bit line 20. Next, a polysilicon layer 34 is formed on the surface of the semiconductor substrate 10. Here, the first source/drain region 32 is formed to have a height sufficient for the first source/drain region 32 to overlap at least a portion of the word line 24a, thus to form a transistor.

Figure 12:
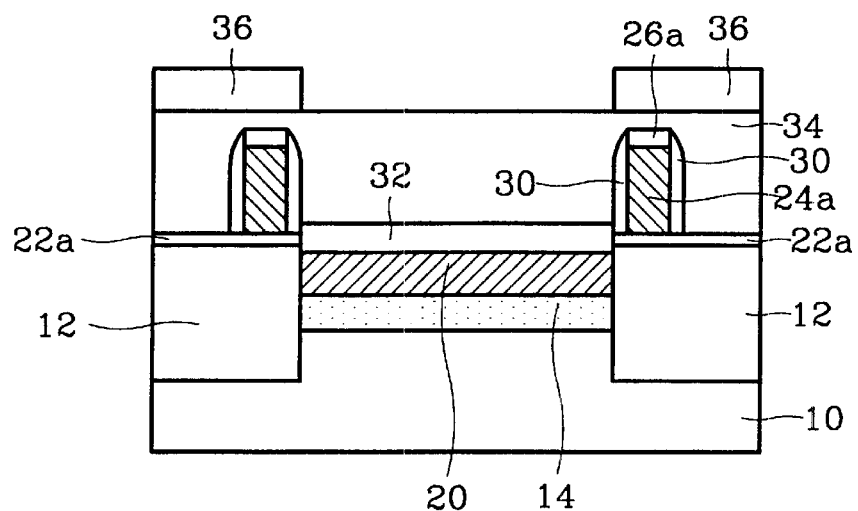

Referring to FIG. 12, the surface of the polysilicon layer 34 is planarized by etching back or through a CMP process so that the polysilicon layer 34 has a predetermined thickness, for example, a thickness of approximately 500–1000 Å, measured from the top surface of the mask layer 26a on the word line 24a. Next, an etching mask pattern 36 of photoresist is formed thereon to define the vertical transistor of each memory cell in a plan view, as can be inferred from FIG. 3.

Figure 13:
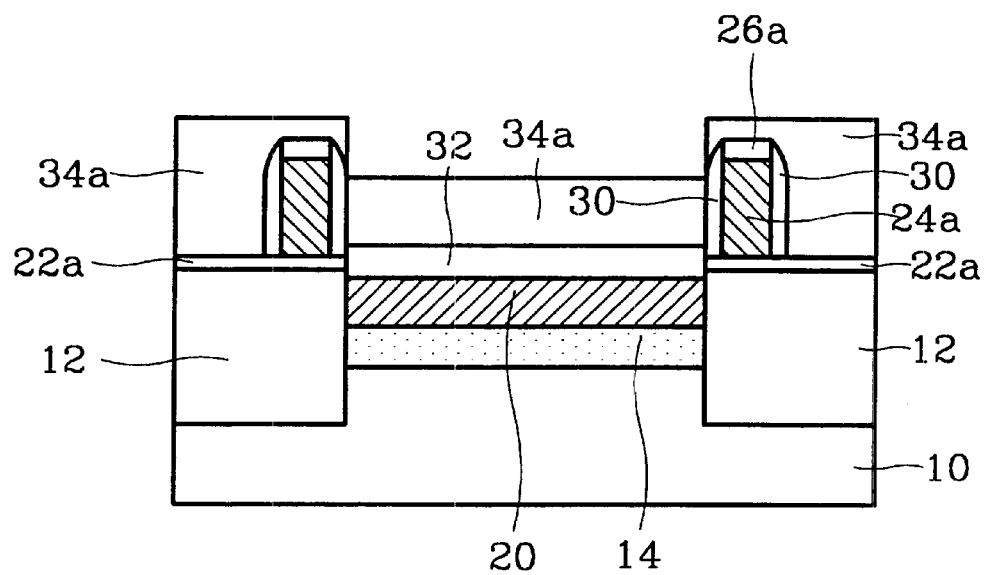

Referring to FIG. 13, the polysilicon layer 34 is etched to a predetermined depth using the etching mask pattern 36 as an etching mask, thereby forming a polysilicon layer pattern 34a. Here, a portion where a vertical transistor will be formed is etched such that the portion is lower than the top surface of the word line 24a.

Subsequently, the etching mask pattern 36 is removed by a typical method. The polysilicon layer pattern 34a remaining on the first source/drain region 32 constitutes a body region including a channel region in the vertical transistor. The polysilicon layer pattern 34a becomes a single integrated body region connected among the transistors of a semiconductor device.

Figure 14:
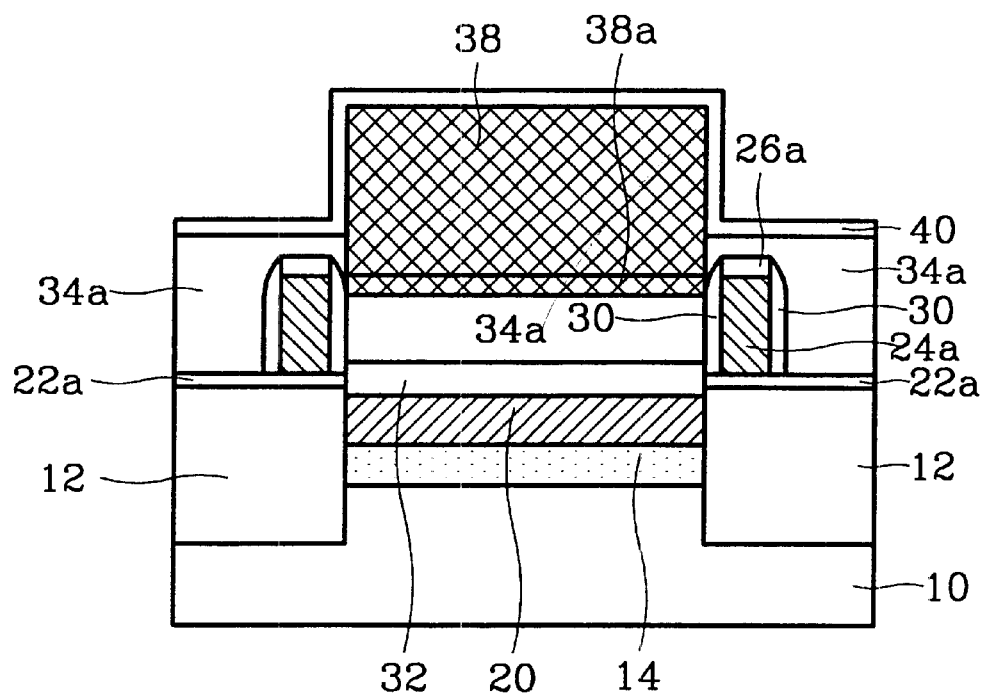
Figure 15:
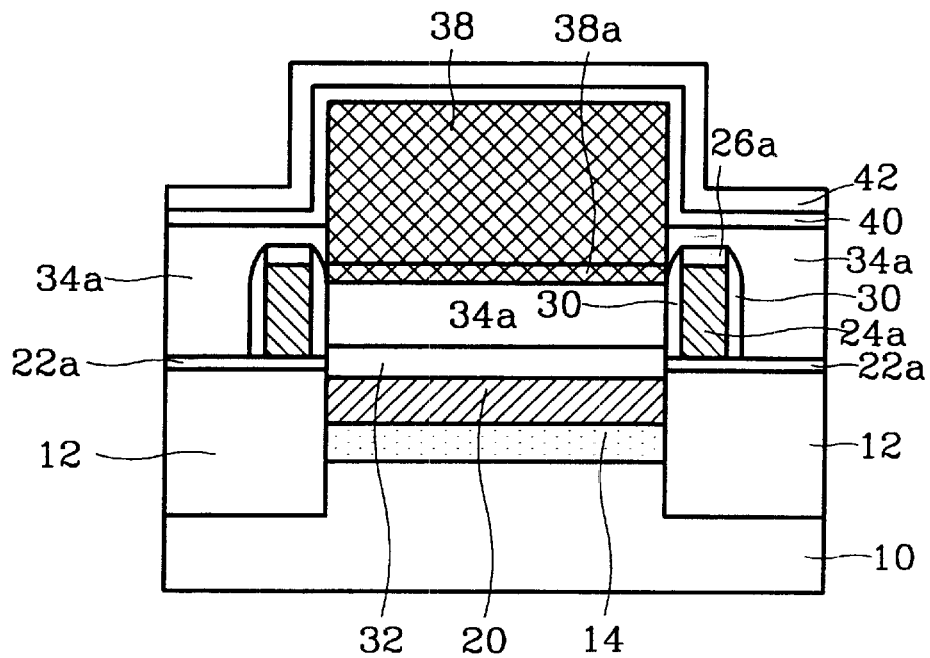

Referring to FIG. 14, a second source/drain region 38a and a storage electrode 38 for a capacitor are selectively formed on the polysilicon layer pattern 34a, which has been etched in FIG. 13 for formation of a vertical transistor, by typical deposition and photolithography. The second source/drain region 38a may be formed of a silicide layer, and the storage electrode 38 may be formed of polysilicon. However, the present invention is not restricted to this embodiment. The second source/drain region 38a and the storage electrode 38 may be formed of the same kind of material layer or different kinds of material layers and may be formed by a single process or separate processes. Next, a dielectric layer 40 of the capacitor is formed over the surface of the semiconductor substrate 10 on which the storage electrode 38 is formed. Then, as shown in FIG. 15, a plate electrode layer 42 of the capacitor is formed. Subsequently, typical memory cell separation and passivation processes are performed to complete the fabrication of a semiconductor memory device.

Figure 16:
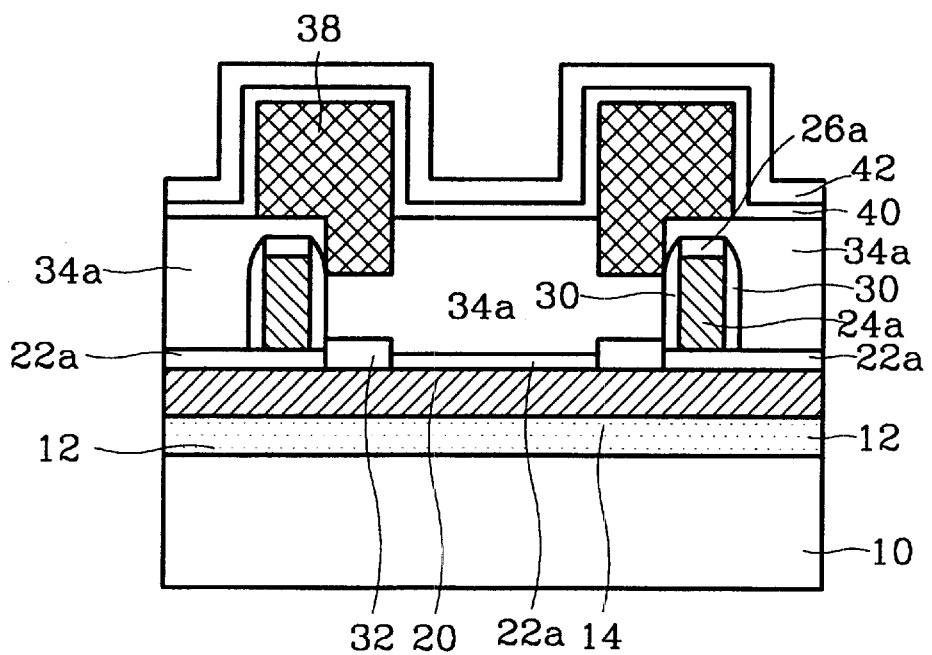
FIG. 16 is a cross-sectional view taken along the line B—B' of FIG. 3 of the semiconductor memory device according to the first embodiment.
Figure 17:
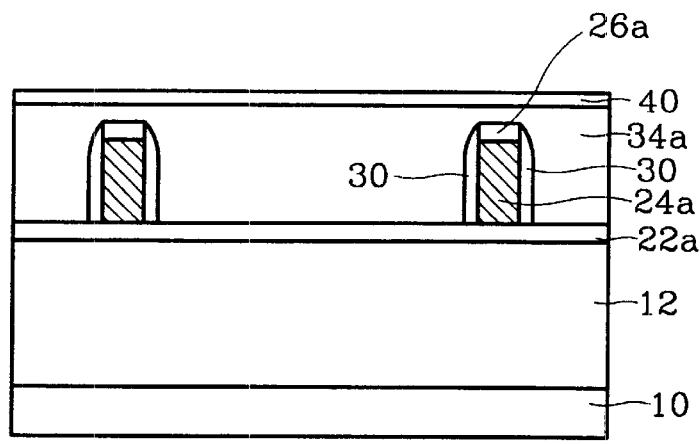
FIG. 17 is a cross-sectional view taken along the line C—C' of FIG. 3 of the semiconductor memory device according to the first embodiment.
Figure 18:
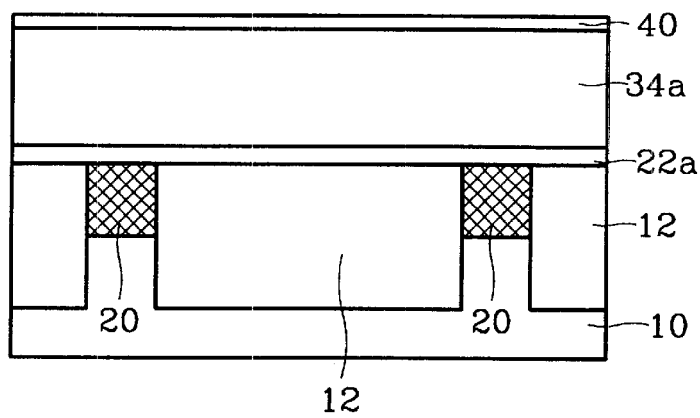
FIG. 18 is a cross-sectional view taken along the line D—D' of FIG. 3 of the semiconductor memory device according to the first embodiment.

FIG. 16 is a cross-sectional view taken along the line B—B' of FIG. 3 of the semiconductor memory device according to the first embodiment. FIG. 17 is a cross-sectional view taken along the line C—C' of FIG. 3. FIG. 18 is a cross-sectional view taken along the line D—D' of FIG. 3. FIGS. 16 through 18 show that the body region including the channel region of each vertical transistor continues throughout the semiconductor substrate 10 forming a single integrated body.

Figure 24:
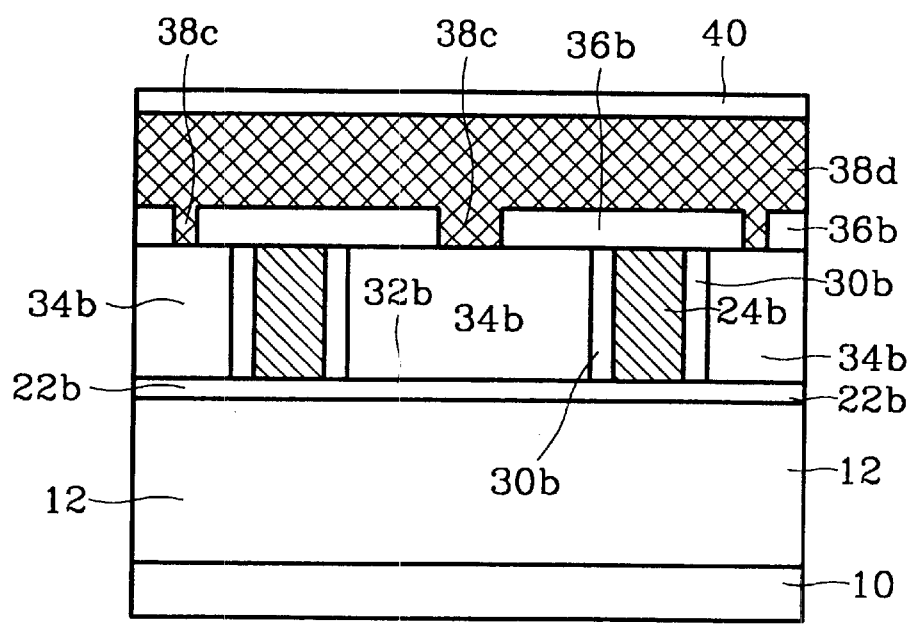
FIG. 24 is a cross-sectional view taken along the line D—D' of FIG. 3 of the semiconductor memory device according to the second embodiment.

FIGS. 19 through 23 are cross-sectional views taken along the line A—A' of FIG. 3 for explaining a method of fabricating a semiconductor memory device according to a second embodiment of the present invention. FIG. 24 is a cross-sectional view taken along the line D—D' of FIG. 3 of the semiconductor memory device according to the second embodiment. The second embodiment, in which body regions of DRAM memory cells isolated by word lines are connected to one another by a bridge-shaped connector 38d shown in FIG. 24 so that they are integrated into a single body, includes the same steps as shown in FIGS. 4 through 7 described in the first embodiment. Thus, a description of the same steps will be omitted.

Figure 19:
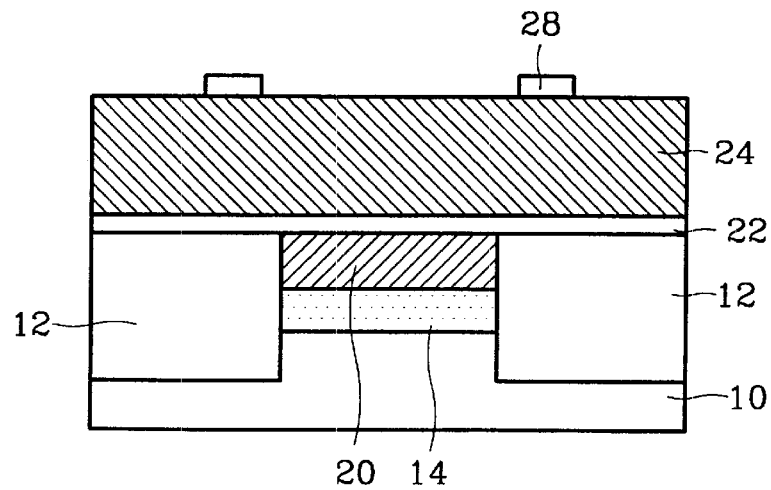
FIGS. 19 through 23 are cross-sectional views taken along the line A—A' of FIG. 3 for explaining a method of fabricating a semiconductor memory device according to a second embodiment of the present invention.

Referring to FIG. 19, an etching mask pattern 28 is formed of photoresist on the polysilicon layer 24 of FIG. 7 to define word lines.

Figure 20:
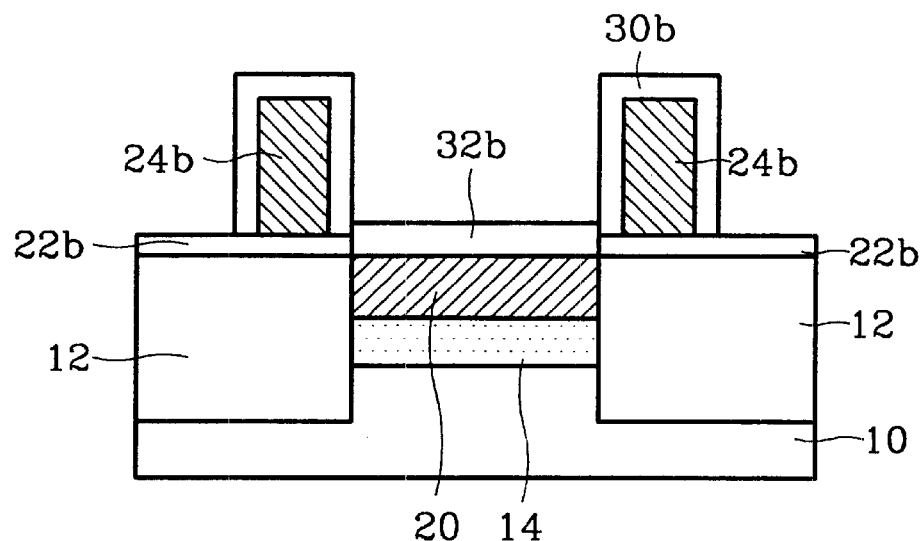

Referring to FIG. 20, the polysilicon layer 24 is anisotropically etched using the etching mask pattern 28 as an etching mask to form word lines 24b. Next, the etching mask pattern 28 is removed, and a thermal oxidation process is performed, thereby forming a second insulation layer 30b of a thermal oxidation layer on the sidewall and top surface of the word line 24b pattern. Subsequently, the first insulation layer 22 is etched and removed from the bit line 20 by selective etching or blanket etching, thereby exposing the bit line 20. Here, as in the first embodiment, a first insulation layer pattern 22b may remain on or be removed from the trench region 12 outside of the word lines 24b, depending on the etching method.

Figure 21:
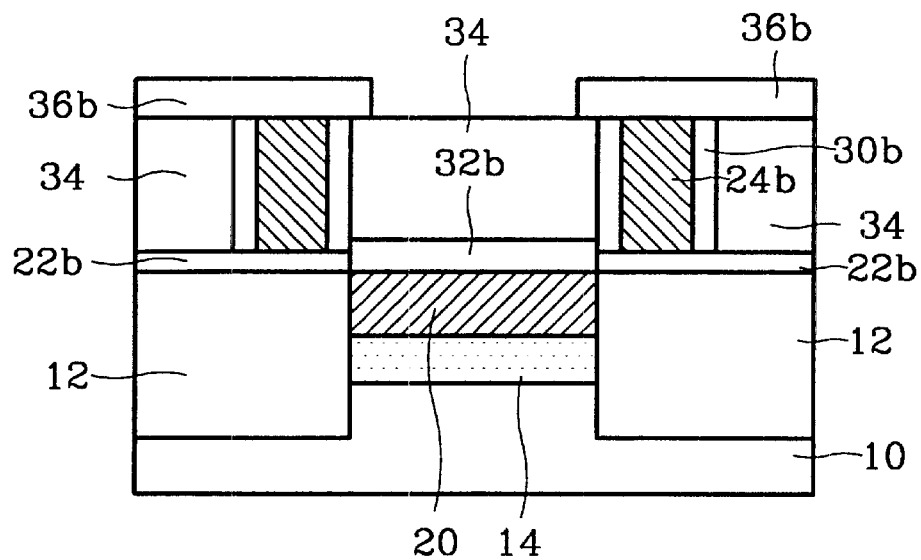

Referring to FIG. 21, a first source/drain region 32b formed of polysilicon or a suicide layer is formed selectively and substantially only on the exposed bit line 20. Here, as described previously, the first source/drain region 32b is formed to have a height sufficient for the first source/drain region 32b to overlap at least a portion of the word line 24b for forming a transistor.

Next, a polysilicon layer 34 is thickly formed on surface of the semiconductor substrate 10 such that the polysilicon layer 34 is positioned higher than the word line (not shown). Subsequently, the substrate 10 including the polysilicon layer 34 is planarized by etching back or through a CMP process until the surface of the word line 24b is exposed. Here, adjacent polysilicon layers 34 are isolated from each other by the word line 24b. Next, a third insulation layer pattern 36b is formed thereon. The third insulation layer pattern 36b is formed of an oxide layer or a nitride layer which has an etching selectivity with respect to the polysilicon layer 34 and the second insulation layer 30b.

As inferred from FIG. 3, the third insulation layer pattern 36b defines the vertical transistor of each memory cell in a plan view. In addition, as shown in FIGS. 3 and 24, since adjacent polysilicon layers 34 are isolated from each other by the word lines 24b, a contact hole pattern 38c of FIG. 24 is formed together with the third insulation pattern 36b in order to connect the polysilicon layers 34 through subsequent steps. It is preferable that at least one contact hole pattern 38c is formed in each polysilicon layer 34 across the strapping area between bit lines 20.

Figure 22:
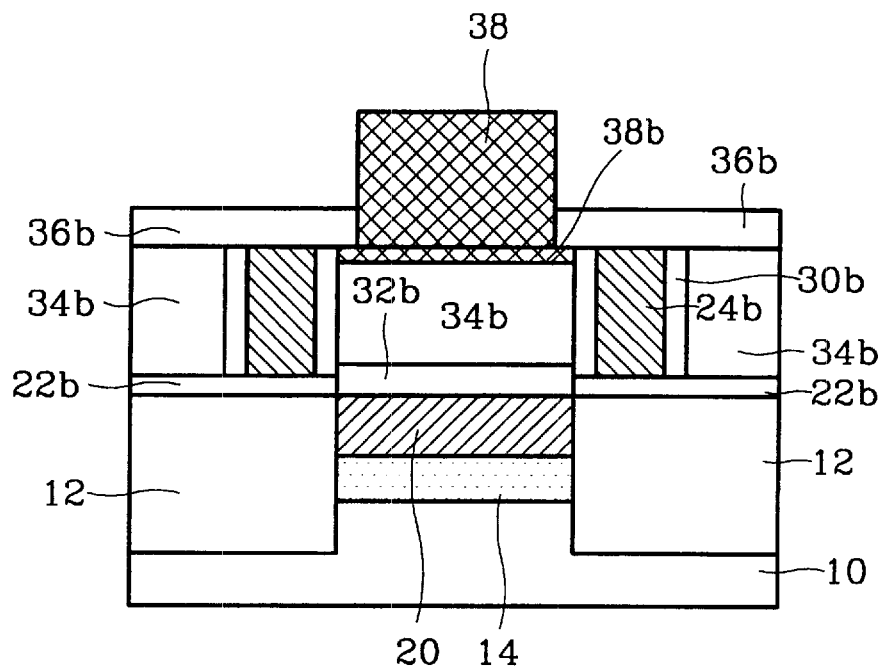
Figure 23:
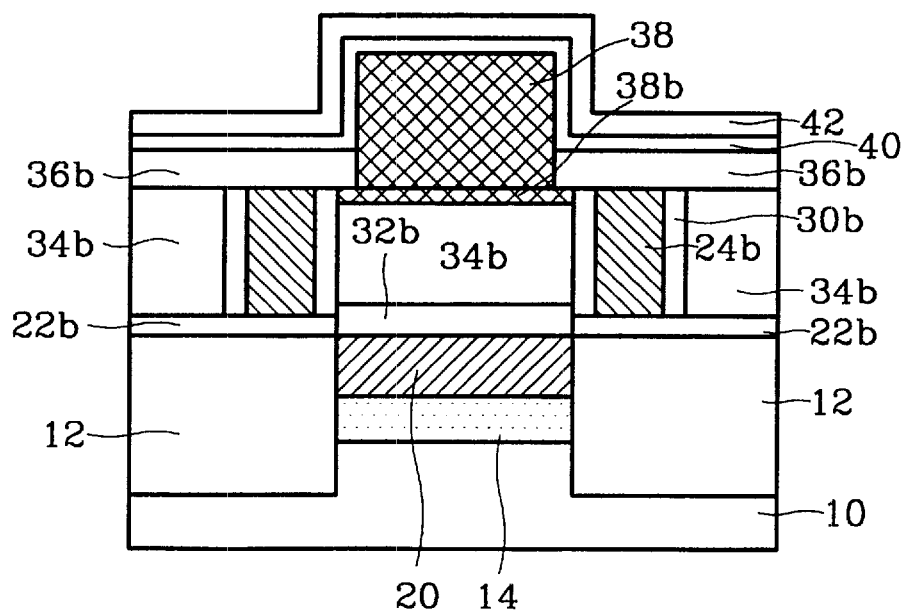

Referring to FIG. 22, the polysilicon layer 34 is wet etched or dry etched to a predetermined depth using the third insulation layer pattern 36b as an etching mask, thereby forming a polysilicon layer pattern 34b. Here, a portion where a vertical transistor is formed is etched to be lower than the word line 24b. Although the polysilicon layer 34 below the contact hole pattern 38c (as shown in FIG. 24) formed across the strapping area is also etched, this does not matter. Subsequently, a second source/drain region 38b and a storage electrode 38 of a capacitor is selectively formed on the polysilicon layer pattern 34b, on which a vertical transistor is formed, by typical deposition and photolithography. The second source/drain region 38b may be formed of a silicide layer, and the storage electrode 38 may be formed of polysilicon. However, the present invention is not restricted to this embodiment. The second source/drain region 38b and the storage electrode 38 may be formed of the same type of material layer or different types of material layers and may be formed by a single process or separate processes. Here, as shown in FIG. 24, the same process performed on the second source/drain region 38b is performed on the contract hole pattern 38c for connecting the isolated polysilicon layers 34b to each other. In other words, the same material layer is deposited on the second source/drain region 38b and the contact hole pattern 38c and etched by photolithography and etching techniques, thereby forming the storage electrode 38 of a capacitor on the second source/drain region 38b and the connector 38d on the contact hole pattern 38c to connect the isolated polysilicon layers 34b. The connector 38d may be seen to have a planar shape when seen from the top.

Again referring to FIG. 23, a dielectric layer 40 of the capacitor is formed over the surface of the semiconductor substrate 10 on which the storage electrode 38 is formed. Then, a plate electrode layer 42 of the capacitor is formed. Subsequently, typical memory cell separation and passivation processes are performed, thereby completing the fabrication of a semiconductor memory device.

According to the present invention, body regions of transistors in individual memory cells do not float but are integrated into a single body so that noise introduced to each memory cell in a memory device can be easily eliminated. As a result, the charge of a body region of each transistor can be maintained constant without being influenced by noise so that malfunction of the transistor can be prevented. In addition, the gate electrode of a vertical transistor is formed to have a quadrilateral shape of which one side is open so that it can be easy to realize a memory cell having an area of $4F^2$.

What is claimed is:

1. A semiconductor memory device, comprising:
    a semiconductor substrate;
    a plurality of bit lines buried in the semiconductor substrate such that the surfaces of the bit lines are adjacent to the surface of the semiconductor substrate, the bit lines arranged in parallel with one another;
    a plurality of word lines formed on the semiconductor substrate such that the word lines cross the bit lines and are isolated therefrom; and
    a plurality of vertical access transistors formed at individual memory cells where the bit lines and the word lines intersect, each vertical access transistor comprising a first source/drain region, a body region including a vertical channel region, and a second source/drain region, which are formed sequentially overlying one of the bit lines, the vertical access transistor contacting a gate insulation layer formed on one side of sidewalls of the word lines, the body regions being connected to one another.

2. The semiconductor memory device of claim 1, wherein the semiconductor memory device is a cell array for a dynamic random access memory.

3. The semiconductor memory device of claim 1, wherein a storage electrode of a capacitor is formed on the second source/drain region of each access transistor.

4. The semiconductor memory device of claim 3, wherein the second source/drain region of each access transistor and the storage electrode of the capacitor are formed of the same material.

5. The semiconductor memory device of claim 3, wherein the second source/drain region of each access transistor and the storage electrode of the capacitor are formed of different materials.

6. The semiconductor memory device of claim 1, further comprising a plurality of trench regions filled with an insulating material being formed in the semiconductor substrate, and wherein the plurality of bit lines are formed between the trench regions.

7. The semiconductor memory device of claim 6, wherein the bit lines are formed of a silicide material.

8. The semiconductor memory device of claim 1, wherein the body regions of the access transistors are formed by a single deposition process and a patterning process, thereby forming a single integrated body.

9. The semiconductor memory device of claim 1, wherein the body regions of the access transistors are isolated from one another by the word lines but connected to one another by a bridge-like connector so that they are integrated.

10. The semiconductor memory device of claim 1, further comprising an insulation layer having the same material as the gate insulation layer being formed on an another side of the sidewalls of the word lines.

11. The semiconductor memory device of claim 1, wherein the word line at which each access transistor is formed has a quadrilateral shape of which one side is open in a plan view, and wherein the channel region of the access transistor is formed within the quadrilateral shape.

12. A semiconductor memory device, comprising:
a semiconductor substrate in which trench regions filled with an insulating material are arranged at predetermined intervals;
a plurality of bit lines arranged in parallel with one another between the trench regions in the semiconductor substrate;
a plurality of word lines extending over the trench regions of the semiconductor substrate such that the word lines cross the bit lines, a top of each word line being covered with an insulating material;
a plurality of vertical access transistors formed at individual memory cells where the bit lines and the word lines intersect, each vertical access transistor comprising a first source/drain region, a body region including a vertical channel region and a second source/drain region which are formed sequentially overlying one of the bit lines, the vertical access transistor contacting a gate insulation layer formed on one side of sidewalls of the word lines; and
integrated plural body regions that are insulated from the word lines, the plural body regions being interconnected over the top of the insulating material that covers each word line.

13. The semiconductor memory device of claim 12, which further comprises a storage electrode of a capacitor formed on the second source/drain region of each access transistor.

14. The semiconductor memory device of claim 12, wherein the bit lines are formed of a silicide material.

15. The semiconductor memory device of claim 12, wherein a thermal oxide layer is formed on an another side of the sidewalls of the word lines, and wherein a silicon nitride layer is formed on the top of the word lines.

16. A semiconductor memory device, comprising:
a semiconductor substrate on which trench regions filled with an insulating material are arranged at predetermined intervals;
a plurality of bit lines arranged parallel to one another between the trench regions on the semiconductor substrate;
a plurality of word lines extending on the trench regions of the semiconductor substrate so that the word lines cross the bit lines;
a plurality of vertical access transistors formed at individual memory cells where the bit lines and the word lines intersect, each vertical access transistor comprising a first source/drain region, a body region including a vertical channel region and a second source/drain region which are formed sequentially overlying one of the bit lines, the vertical access transistor contacting a gate insulation layer formed on one side of the sidewalls of the word lines, the body region being insulated from the word lines; and
a connector for electrically connecting body regions of at least two adjacent vertical transistor of said plurality.

17. The semiconductor memory device of claim 16, which further comprises a storage electrode of a capacitor formed on the second source/drain region of each access transistor.

18. The semiconductor memory device of claim 16, wherein the bit lines are formed of a silicide material.

19. The semiconductor memory device of claim 16, wherein an insulation layer which is the same as an insulation layer defining the second source/drain region of each access transistor is formed on top of each word line.

20. A method of fabricating a semiconductor memory device, comprising:
forming trench regions filled with an insulating material at predetermined intervals, the trench regions being buried in a semiconductor substrate such that they are adjacent to the surface of the semiconductor substrate;
forming a bit line between adjacent trench regions in the semiconductor substrate;
sequentially forming a first insulation layer, a conductive layer for a word line and a mask layer of an insulating material over the resulting structure including the bit line;
forming a word line having the mask layer on its top surface overlying the trench regions;
forming a second insulation layer on the sidewall of the exposed word line;
exposing a portion of the surface of the bit line adjacent to the sidewall of the word line where the word line and the bit line intersect;
forming a first source/drain region material layer on the exposed bit line;
forming a body region material layer on the semiconductor substrate including the first source drain region material layer such that the body region material layer has a predetermined height from the mask layer on the word line;
etching a portion of the body region material layer to form a body region on the first source/drain region material layer; and
forming a second source/drain material layer on the body region.

21. The method of claim 20, further comprising the step of forming a storage electrode material layer for a capacitor on the second source/drain region material layer.

22. The method of claim 20, wherein the second insulation layer formed on the sidewall of the word line is a thermal oxide layer, and wherein the mask layer formed on the top surface of the word line is a silicon nitride layer.

23. The method of claim 20, wherein the word line where the bit line and the word line intersect has a quadrilateral shape of which one side is open in a plan view, and wherein the first and second source/drain region material layers are formed within the quadrilateral shape.

24. A method of fabricating a semiconductor memory device that does not have a floating body effect, comprising the steps of:

forming trench regions filled with an insulating material at predetermined intervals, the trench regions being buried in a semiconductor substrate such that they are adjacent to the surface of the semiconductor substrate;

forming a bit line between adjacent trench regions in the semiconductor substrate;

sequentially forming a first insulation layer and a conductive layer for a word line over the resulting structure including the bit line;

forming a word line on the first insulation layer;

forming a second insulation layer on the word line;

exposing a portion of the surface of the bit line adjacent to the sidewall of the word line where the word line and the bit line intersect;

forming a first source/drain region material layer on the exposed bit line;

forming a body region material layer on the semiconductor substrate including the first source drain region material layer such that the body region material layer is positioned higher than the word line;

planarizing the semiconductor substrate including the body region material layer until the surface of the word line is exposed;

forming a third insulation layer on the surface of the planarized semiconductor substrate;

etching a portion of the third insulation layer to expose the portion of the body region material layer overlying the first source/drain region material layer;

etching a portion of the body region material layer to a predetermined depth using the etched third insulation layer as an etching mask; and forming a second source/drain material layer on the etched body region material layer.

25. The method of claim 24, wherein during the step of etching a portion of the third insulation layer, contact holes exposing the body region material layer isolated from another one by the word line are concurrently formed.

26. The method of claim 25, wherein during the step of forming the second source/drain region material layer, the same material layer as the second source/drain region material layer is formed in the contact holes exposing the body region material layer.

27. The method of claim 26, wherein during the step of forming the second source/drain region material layer, a connector for connecting the body region material layers isolated by the word line using the contact holes is concurrently formed.

28. The method of claim 24, further comprising the step of forming a storage electrode material layer for a capacitor on the second source/drain region material layer.

29. The method of claim 24, wherein the word line where the bit line and the word line intersect has a quadrilateral shape of which one side is open in a plan view, and wherein the first and second source/drain region material layers are formed within the quadrilateral shape.

* * * * *

UNITED STATES PATENT AND TRADEMARK OFFICE
CERTIFICATE OF CORRECTION

PATENT NO. : 6,573,545 B2
DATED : June 3, 2003
INVENTOR(S) : Kim et al.

It is certified that error appears in the above-identified patent and that said Letters Patent is hereby corrected as shown below:

<u>Column 7,</u>
Line 38, "a suicide layer" should read -- a silicide layer --.

<u>Column 10, line 36 through Column 12, line 35,</u>
Claim 20 through Claim 29 should be deleted.

Signed and Sealed this

Twentieth Day of April, 2004

JON W. DUDAS
*Acting Director of the United States Patent and Trademark Office*